United States Patent
Wen et al.

(10) Patent No.: US 9,794,634 B2
(45) Date of Patent: Oct. 17, 2017

(54) SYSTEM, DEVICE AND METHOD FOR VIEWING AND CONTROLLING AUDIO VIDEO CONTENT IN A HOME NETWORK

(71) Applicant: STARTIMES COMMUNICATION NETWORK TECHNOLOGY CO. LTD., Beijing (CN)

(72) Inventors: Jiangtao Wen, Walnut, CA (US); Yi Pang, Beijing (CN); Min Wang, Beijing (CN); Chao Zhang, Beijing (CN); Libo Jiao, Beijing (CN); Zhenyu Wang, Beijing (CN)

(73) Assignee: STARTIMES COMMUNICATION NETWORK TECHNOLOGY CO. LTD., Beijing (CN)

( * ) Notice: Subject to any disclaimer, the term of this patent is extended or adjusted under 35 U.S.C. 154(b) by 0 days.

(21) Appl. No.: 14/260,100

(22) Filed: Apr. 23, 2014

(65) Prior Publication Data
US 2015/0264444 A1    Sep. 17, 2015

(30) Foreign Application Priority Data

Mar. 14, 2014 (CN) .......................... 2014 1 0095395

(51) Int. Cl.
| | |
|---|---|
| *G06F 3/00* | (2006.01) |
| *G06F 13/00* | (2006.01) |
| *H04N 5/445* | (2011.01) |
| *H04N 21/482* | (2011.01) |
| *H04N 21/436* | (2011.01) |
| *H04N 21/44* | (2011.01) |
| *H01Q 1/52* | (2006.01) |
| *H01Q 7/00* | (2006.01) |
| *H03H 1/00* | (2006.01) |

(Continued)

(52) U.S. Cl.
CPC ............. *H04N 21/482* (2013.01); *H01Q 1/52* (2013.01); *H01Q 7/00* (2013.01); *H03H 1/0007* (2013.01); *H04N 21/43615* (2013.01); *H04N 21/44008* (2013.01); *H05K 1/0228* (2013.01); *H03H 2001/0078* (2013.01); *H04B 3/28* (2013.01); *H05K 1/165* (2013.01)

(58) Field of Classification Search
USPC ...................................................... 725/38–39
See application file for complete search history.

(56) References Cited

U.S. PATENT DOCUMENTS

| | | | |
|---|---|---|---|
| 8,763,038 B2* | 6/2014 | Candelore .............. | G06K 9/325 |
| | | | 725/39 |
| 9,100,699 B2* | 8/2015 | Pratt .................. | H04N 21/4621 |

(Continued)

OTHER PUBLICATIONS

International Search Report and Written Opinion for International Application No. PCT/US 14/36069; Sep. 25, 2014; 8 pages.

*Primary Examiner* — Mulugeta Mengesha
(74) *Attorney, Agent, or Firm* — Stetina Brunda Garred & Brucker

(57) ABSTRACT

An audio/video device may determine that a UI is displayed in a first AV signal, and may capture a frame of the UI in order to provide UI information to a UI generation component that generates a second UI. The AV device may then provide the second UI for display in place of the first UI. The AV device may act as a virtual controller device capable of controlling multiple devices and streaming content from multiple devices to multiple displays.

27 Claims, 8 Drawing Sheets

(51) Int. Cl.
*H05K 1/02* (2006.01)
*H04B 3/28* (2006.01)
*H05K 1/16* (2006.01)

(56) References Cited

U.S. PATENT DOCUMENTS

| | | |
|---|---|---|
| 2001/0053274 A1 | 12/2001 | Roelofs et al. |
| 2009/0187950 A1 | 7/2009 | Nicas et al. |
| 2010/0192178 A1 | 7/2010 | Candelore |
| 2011/0262105 A1* | 10/2011 | Candelore ............... 386/244 |
| 2013/0091524 A1* | 4/2013 | Hong ............... H04N 21/4332 |
| | | 725/49 |
| 2014/0143817 A1* | 5/2014 | Yeh ............................. 725/100 |
| 2015/0100623 A1* | 4/2015 | Gudell et al. ............... 709/203 |

* cited by examiner

SYSTEM, DEVICE AND METHOD FOR VIEWING AND CONTROLLING AUDIO VIDEO CONTENT IN A HOME NETWORK

CROSS REFERENCE TO RELATED APPLICATIONS

The present application claims priority to Chinese Patent Application No. UNKNOWN filed Mar. 14, 2014, the entire contents of which are expressly incorporated herein by reference.

STATEMENT RE: FEDERALLY SPONSORED RESEARCH/DEVELOPMENT

Not Applicable.

BACKGROUND

The current description relates to audio and video devices, and in particular to viewing and controlling audio and video content in a home network.

The entertainment experience of the home has become ever more networked, with multiple content sources and multiple devices capable of displaying the content. For example, a home may have cable and/or satellite television received using a set-top-box (STB) connected to a large screen television. Over-the-top (OTT) services such as Netflix, Hulu Plus and others may be received from a separate device, such as an OTT STB, game console or computer connected to the same TV or a second TV in a separate room. Value-added services such as cloud gaming, video conference calls, video surveillance and etc. delivered to either one or both TVs, as well as various video content may be accessed by one or more computing devices, such as phones, tablets, laptops or computers over a home network.

Each of the content providing and/or consuming devices may provide their own user interface for interacting with the audio/video content. As a result, the functionality, ease of use, user interface (UI), and the overall user experience (e.g. video resolution such as standard definition, high definition and ultra high definition) may differ across the devices. The different UIs complicate sharing of the different services and content across different devices. For example, a user may need to learn different UIs and input devices in order to navigate through the content provided by the various devices. Further, the UIs provided by the different content providers may not be adapted for display on all possible devices, that is, a UI that may be appropriate for display on a large screen TV may not be appropriate for use on a much smaller phone screen.

BRIEF DESCRIPTION OF THE DRAWINGS

Features, aspects and advantages of the present disclosure will become better understood with regard to the following description and accompanying drawings in which.

DETAILED DESCRIPTION

Figure 1:
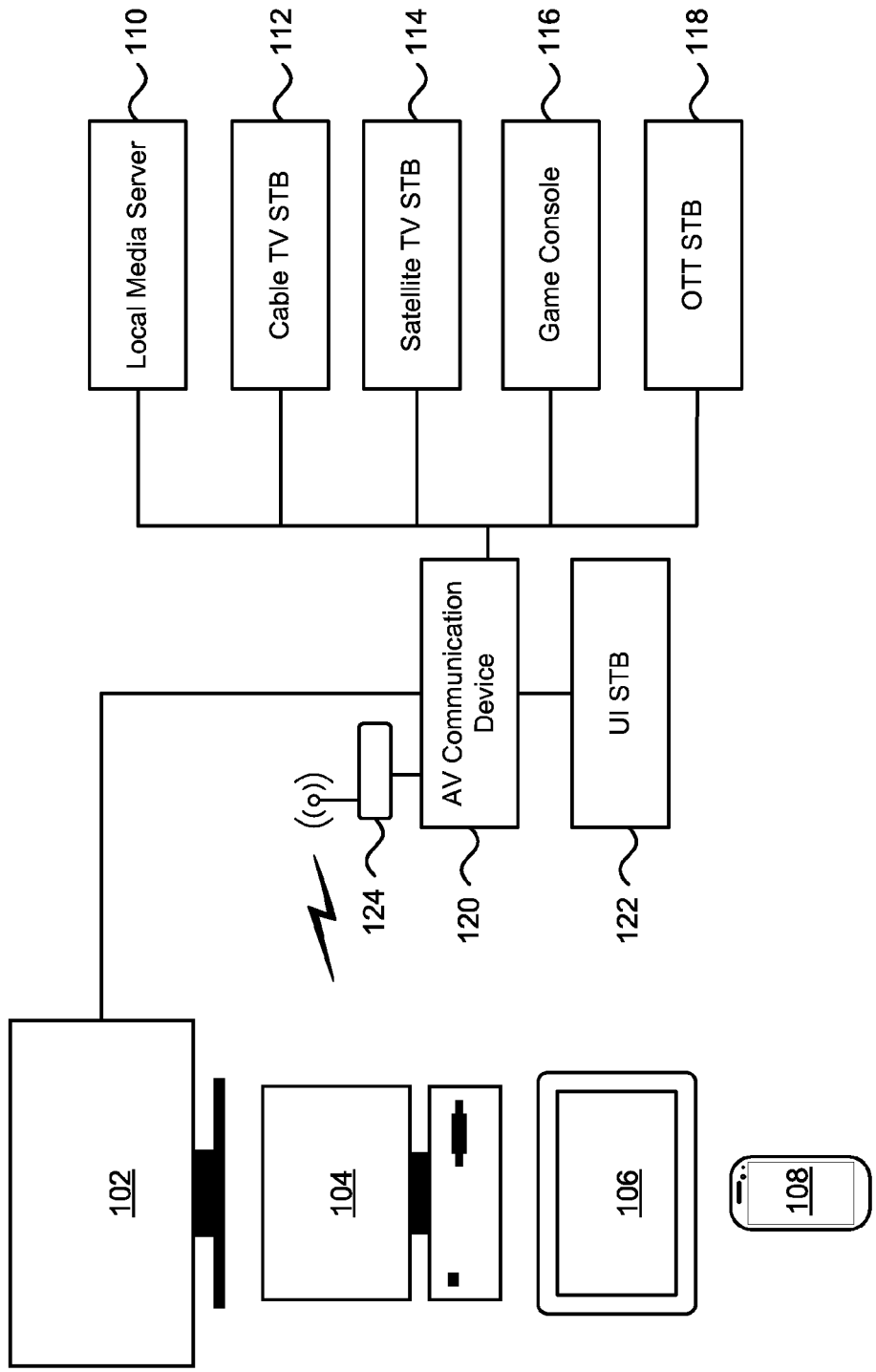
FIG. 1 depicts an environment for viewing and controlling audio video content in a home network.

In accordance with the present disclosure there is provided an audio/video (AV) device comprising: a first AV input for receiving a first AV signal from a first AV source device; an AV output for providing AV content to be displayed; and a processor for executing instructions stored in a memory, which when executed configure the AV device to: determine that a first user interface (UI) is displayed by the first AV signal; capture a frame of the first UI from the first AV signal; provide UI information from the captured frame to a user interface (UI) generation component for generating a second UI; and provide a second AV signal of the generated second UI to the AV output.

In an embodiment of the AV device, the instructions further configure the AV device to: perform optical character recognition (OCR) on the first UI of the captured frame to determine the UI information.

In an embodiment the AV device further comprises: a second AV input for receiving a second AV signal from a second AV source device capable of generating the second UI incorporating the UI information, wherein the instructions further configure the AV device to communicate the UI information to the second AV source device; and receive a UI signal of the second UI from the second AV device for use as the second AV signal.

In an embodiment of the AV device, the instructions to determine that the first UI is displayed comprise instructions to receive a control command for the first AV source to display the first UI.

In an embodiment of the AV device, the instructions to determine that the first UI is displayed further comprise instructions to provide the received control command to the first AV source device to display the first UI.

In an embodiment of the AV device, the instructions further comprise instructions allowing interaction with the second UI.

In an embodiment of the AV device, the instructions further comprise instructions for providing to the AV output AV content from the first AV source selected from the second UI.

In an embodiment of the AV device, the control command is received over an infrared (IR) channel.

In an embodiment the AV device further comprises a network interface for providing one or more AV signals to one or more display devices.

In an embodiment of the AV device, the one or more display devices comprise one or more communication devices connected to a common local network and/or one or more communication devices connected to a remote network.

In an embodiment of the AV device, the instructions further configure the AV device to provide AV functionality including one or more of: accessing local AV content; accessing remote AV content; and playing games.

In an embodiment of the AV device, the instructions further configure the AV device to authenticate the one or more display devices to provide the one or more AV signals.

In an embodiment of the AV device, the first UI comprises an electronic programming guide (EPG) generated by the first AV source device.

In an embodiment the AV device comprises: a content streaming component for generating AV content to be displayed and transmitting the AV content as a bitstream; and a content receiving component for receiving the bitstream and generating an AV content signal suitable for display.

In an embodiment of the AV device, the content streaming component and the content receiving component communicate using a wireless communication channel.

In an embodiment of the AV device, the AV device is adapted to receive AV content from a plurality of AV source devices.

In an embodiment of the AV device, the AV device is adapted to stream AV content from one or more of the plurality of AV sources to one or more display devices.

In an embodiment of the AV device, the AV device is a virtual controller device adapted for controlling multiple devices.

In accordance with the current description, there is further provided a method for providing a user interface by an audio/video (AV) device, the method comprising: determining that a first user interface (UI) is displayed by a first AV signal from a first AV source device; capturing a frame of the first UI from the first AV signal; providing UI information from the captured frame to a user interface (UI) generation component for generating a second UI; and providing a second AV signal of the generated second UI to the AV output.

In an embodiment the method further comprises performing optical character recognition (OCR) on the first UI of the captured frame to determine the UI information.

In an embodiment of the method, the UI generation component is provided by a second AV device, the method further comprising: communicating the UI information to the second AV source device; and receiving a UI signal of the second UI from the second AV device for use as the second AV signal.

In an embodiment of the method, the determining that the first UI is displayed comprises receiving a control command for the first AV source to display the first UI.

In an embodiment of the method, determining that the first UI is displayed further comprises providing the received control command to the first AV source device to display the first UI.

In an embodiment the method further comprises allowing interaction with the second UI.

In an embodiment the method further comprises providing to the AV output AV content from the first AV source selected from the second UI.

In an embodiment of the method, the control command is received over an infrared (IR) channel.

In an embodiment the method further comprises authenticating one or more display devices to provide one or more AV signals.

In an embodiment of the method, wherein the first UI comprises an electronic programming guide (EPG) generated by the first AV source device.

In an embodiment the method further comprises generating AV content to be displayed; transmitting the AV content as a bitstream; receiving the bitstream; and generating an AV content signal suitable for display.

In an embodiment of the method, the AV content is transmitted using a wireless communication channel.

In an embodiment of the method, the AV device is adapted to receive AV content from a plurality of AV source devices.

In an embodiment of the method, the AV device is adapted to stream AV content from one or more of the plurality of AV sources to one or more display devices.

In an embodiment of the method, the AV device is a virtual controller device adapted for controlling multiple devices.

As described further herein, one or more audio/video (AV) devices may provide a user interface, such as an electronic programming guide, control menu, content selection menu etc. The user interface may be captured and processed in order to generate a more user friendly interface provided by another AV device. Accordingly, a number of content sources can be combined together and use a common user interface. Further, the AV device may act as a virtual controller device to allow the connected devices to be controlled by various input devices that were not originally designed for controlling the device. In addition to providing an output to a single display device such as a television, the AV device may enable streaming of AV content from one or more of the connected content sources to one or more display devices. The user interface provided by the AV device may be adapted based on the type of device the content is provided to. The system, device and method described herein may be used to distribute AV content from multiple sources to multiple devices while providing a unified user interface.

FIG. 1 depicts an environment for viewing and controlling audio video content in a home network. The home environment may include various devices for viewing audio/video (AV) content as well as a number of AV devices that provide the AV content. The display devices may include one or more televisions 102, personal computers (PCs) 104, tablets 106, and smartphones 108. Each of the display devices may receive AV content from one or more sources. The AV content may be received over AV specific connectors, such as HDMI, component-video, S-video, Display port, VGA or other types of connectors. Additionally, or alternatively, the AV content may be received over a network, such as an internal home network, and/or the Internet.

The AV content displayed on the different displays may be provided by a number of different components. As depicted in FIG. 1, the content sources may include, for example a local media server 110, a cable TV STB 112, a satellite TV STB 114, a game console 116, as well as an over the top (OTT) STB 118 that may provide access to network based content services such as Netflix, Youtube, Hulu, etc. Each of the content sources may provide one or more AV output signals over one or more different types of connectors such as HDMI, component-video, S-video, Display port, VGA or other types of connectors as well as over a network connection. Further, each of the content sources may be controlled using one or more different control devices. For example, STBs may be conventionally controlled using an infrared (IR) remote control. Other control techniques are possible, including for example communicating control commands using a Bluetooth remote control, communicating control commands from a device using a network connection or other control channel. The various control commands will depend upon the content source being controlled, but may include, for example commands for changing channels, displaying an electronic programming guide (EPG) or other user interface (UI), navigating within the EPG or UI, selecting content or elements in the EPG or UI and setting or configuring options of the content source. The control devices may include devices such as game controllers, control interfaces provided on remote devices such as smartphones or tablets and other communication devices.

As depicted in FIG. 1, rather than being connected directly to a display device, the content sources may be connected to an AV communication device 120. The AV communication device 120 may have multiple AV inputs for receiving AV content from multiple sources. The AV communication device 120 may further include a plurality of AV content outputs for connecting the AV communication device 120 to one or more display devices. The AV content may be provided from the AV communication device 120 to one or more of the displays using an AV connector such as HDMI, component-video, S-video, Display port, VGA or other types of connectors. Further, the AV communication device 120 may provide the AV content to the display devices using a network connection. As depicted, the network connection may be provided by a connection to a router 124 which may provide both wired and wireless connections to display devices. Although depicted as a single router providing the network connection, other network appliances may be involved in providing the network connections to other devices.

The AV communication device 120 may allow AV content from the connected content sources to one or more of the display devices. The AV communication device 120 may transcode, compress, and/or resize the audio and/or video component of the AV content when providing content to different display devices. The transcoding, compressing and/or resizing may be done based on a number of factors including, configured settings, preferences, digital rights requirements, network connection characteristics, and display device characteristics.

The AV communication device 120 may further include capabilities for controlling one or more AV content sources. For example, the AV communication device 120 may include an IR emitter for controlling one of the content sources as if the AV communication device 120 was a remote. The AV communication device 120 may control connected content sources using control techniques other than IR communication. The AV communication device 120 may itself be controlled using different control techniques, such as an IR remote, a networked device or other control devices. The AV communication device 120 may control devices using a communication protocol shared between the AV communication device 120 and the device or devices being controlled.

In addition to the existing content sources, the AV communication device 120 may also be connected to a User Interface (UI) STB 122. The UI STB 122 may provide a preferred User Interface for interacting and controlling content. The UI STB 122 may also provide similar functionality of one or more of the existing content sources. As described further below, the AV communication device 120 can substitute the preferred UI provided by the UI STB 122 in place of an EPG or UI provided by one of the existing content sources. For example, if the AV communication device 120 is providing a TV channel to the television 102 from the cable TV STB 112 and the user displays the EPG on the cable TV STB, the AV communication device 120 may detect that the EPG is displayed and substitute the EPG with a UI provided by the UI STB 122. Accordingly, a potentially older and/or less desirable EPG or UI, for example provided by legacy content sources, may be replaced by a more desirable UI provided by the UI STB.

Figure 2:
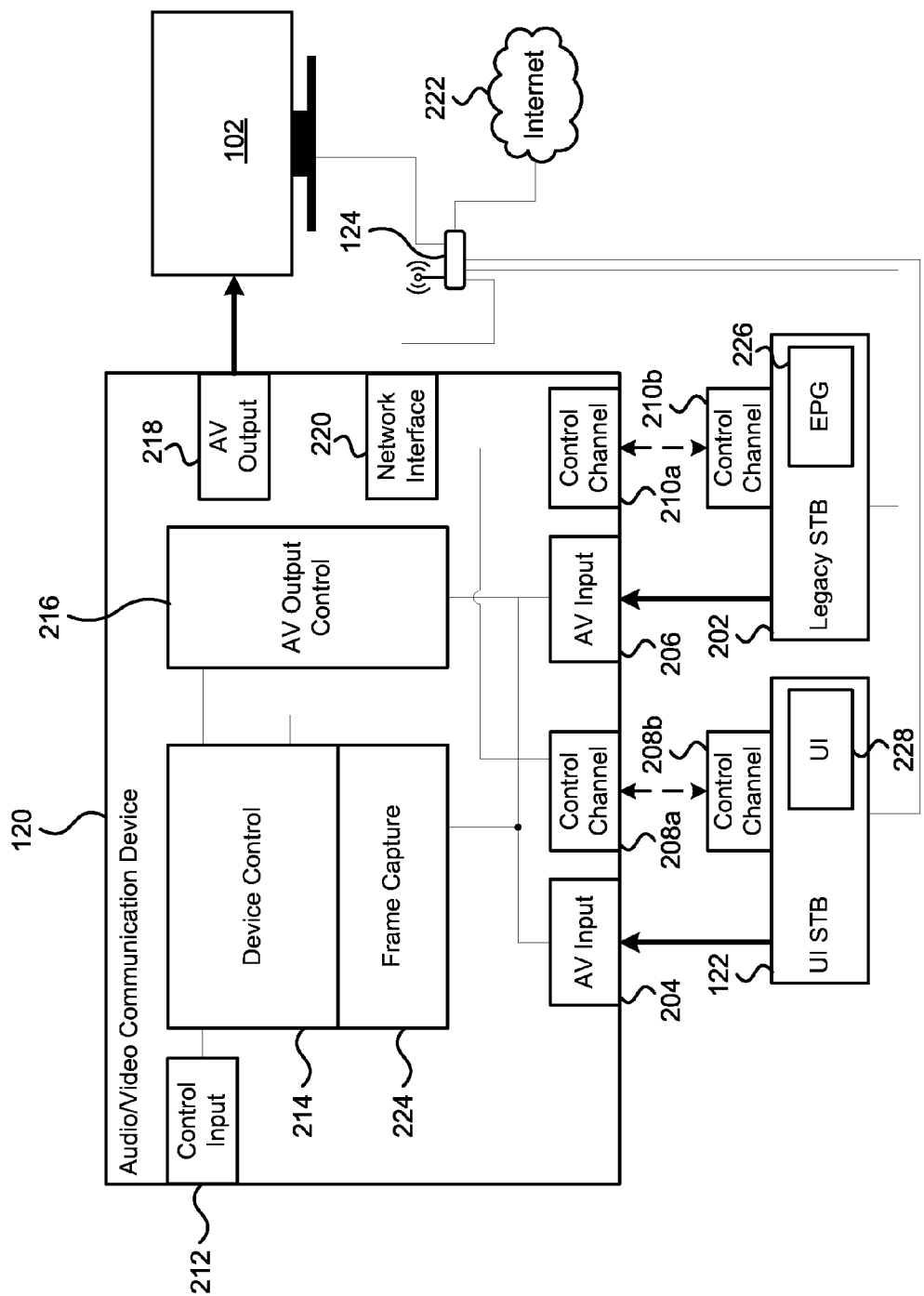
FIG. 2 depicts audio/video components in a home network.

FIG. 2 depicts audio/video components in a home network. As depicted, a legacy STB 202, such as cable TV STB 112 or satellite TV STB 114 described above, and a UI STB 122 that is capable of providing a preferred UI are coupled to a television 102 through an AV communication device 120. Although only a single display device, namely television 102, is depicted in FIG. 2, the AV communication device 120 may include a number of different AV outputs for providing AV content to multiple display devices at the same time. Further, the AV content may be streamed to display devices over a network or direct wireless connection. The AV communication device 120 may provide the same AV content to each of the display devices concurrently, or different display devices may receive different AV content.

The AV communication device 120 includes a number of AV inputs for receiving AV signals. Two AV inputs 204, 206 are depicted in FIG. 2, although more or fewer inputs may be provided. As depicted, the AV input 204 receives an AV signal from the UI STB 122 and the AV input 206 receives an AV signal from the legacy STB 202.

The AV communication device 120 can provide control commands to both the UI STB 122 and the legacy STB 202 over respective control channels. The control channels may be provided using various communication techniques and protocols. For example, the control channel 208a, 208b (referred to collectively as control channel 208) for controlling the UI STB 122 may be provided by respective control channel components 208a, 208b in the AV communication device 120 and the UI STB 122 respectively. The control channel 208 may be provided by a wired or wireless connection. Further, the control channel 208 may provide one-way communication or two-way communication between the devices. Illustrative control channels may include IR communication channels, RF communication channels, such as Bluetooth, network based communication, which may send control commands over a wired or wireless network, or other proprietary wired or wireless communication. Similarly, the control channel 210a, 210b (referred to collectively as control channel 210) for controlling the legacy STB 202 may be provided by respective control channel components 210a, 210b in the AV communication device 120 and the legacy STB 202 respectively. The control channel 210 may be provided by a wired or wireless connection. Further, the control channel 210 may provide one-way communication or two-way communication between the devices. Illustrative control channels may include IR communication channels, RF communication channels, such as Bluetooth, network based communication, which may send control commands over a wired or wireless network, or other proprietary wired or wireless communication.

The AV communication device 120 may include control input functionality 212 for controlling the AV communication device 120. The control input functionality 212 may receive commands over different control channels. Illustrative control channels may include IR communication channels, RF communication channels, such as Bluetooth, network based communication which may send control commands over a wired or wireless network, or other proprietary wired or wireless communication. The control input 212 allows a user to control operation of the AV communication device 120, and since the AV communication device is capable of controlling connected devices, also allows the user to control the connected devices.

The AV communication device 120 further comprises device control functionality 214 for controlling the operation of the AV communication device 120. The device control functionality allows the AV communication device to receive the AV signals of connected devices and distribute the signals for output. For example, the device control functionality 214 may include functionality for selecting, which AV signal to provide to particular display devices.

Further, the device control functionality may allow the AV communication device to communicate control commands to the attached devices. As an example, the device control functionality 214 may receive a control command, such as "Channel Up" from the control input functionality 212 and cause the appropriate channel change command to be sent over the control channel 210 to the legacy STB 202. The legacy STB changes the channel, and the content received by the legacy STB 202 may then be transmitted back to the AV communication device 102 and displayed on connected devices, possibly with a preferred User Interface.

Further, the device control functionality 214 may control how the AV output is processed prior to being output to a particular device. For example, the device control functionality 214 may cause an AV signal to be compressed and down-sampled in order to reduce the bandwidth required to provide the AV content to a network connected display device. The device control functionality 216 may co-operate with AV output control functionality 216 in order to provide the output to respective display devices, which may be connected to an AV output 218 of the AV communication device 120 and/or may be coupled to a network interface 220 of the AV communication device 120 by a home network router 124 and/or the internet 222. The AV output control functionality 218 allows the conversion of the AV signal received from the various connected content sources to be converted, if necessary, to appropriate forms for the display devices. For example, the AV output control functionality may include one or more digital to analog AV encoders or one or more transcoders for processing AV signals for output.

The AV communication device 120 may further include frame capture functionality 224 that can capture one or more frames of content from a connected device. The frame capture functionality 224 may be used to capture a frame of content when an EPG is displayed, for example by the legacy device 202, which as depicted includes functionality for generating the EPG 226. The captured EPG frame may be processed, either by the AV communication device 120 or the UI STB 122 in order to generate a UI using UI generation functionality 228 of the UI STB. For example, the frame capture functionality 224 may capture a frame of an EPG generated by the legacy device. The captured frame may be processed to identify EPG content within the frame, for example using optical character recognition (OCR). The identified EPG content may then be used by the UI generation functionality 228 of the UI STB 122 to generate a UI based on the EPG content. The AV communication device 120 may substitute the generated UI for the EPG of the legacy STB. Accordingly, a similar UI experience may be provided for connected devices, regardless of if the connected devices are capable of providing the UI experience or if they are only capable of providing a different EPG or UI experience.

The AV communication device 120 may stream AV content received by one or more legacy STBs or content sources to one or more display devices such as a tablet or smart phone connected to the AV communications module over a network, or a TV connected directly to the AV communication device 120. The connection and the content that is streamed may be protected via means such as passwords, authentication and content bitstream encryption.

When the AV communication device 120 is connected to a legacy STB as well as a UI STB, as depicted in FIG. 2, not only will the user be capable of streaming content received by the legacy STB to one or more display devices, the user will also be able to view content from the UI STB on display devices, including television 102. Furthermore, the AV communication device may capture inputs from an input device, such as a remote control, a game controller, or a remote control app on a smartphone or tablet and transmit the inputs to the UI STB in order to control services on the UI STB. The control signals received by the AV communication device may also be transmitted to a connected AV device, such as a legacy STB, in order to control the legacy STB. The AV communication device 120 may capture the commands from the input device and convert them to digital bitstreams that can be transmitted over a network by the AV communication device, possibly using a proprietary protocol between the communications module and the UI STB. An application on the UI STB may receive the input commands and react accordingly. The resulted audio and visual outputs can then be captured and compressed into digital audio and visual bitstreams that are transmitted to the AV communication device 120, which may convert the digital video and audio signal into an appropriate format that can be played back on the display devices. For the legacy STB, the AV communication device 102 may convert the control signal into control signals compatible with the legacy STB, for example into properly encoded infrared signals.

The AV communication device may capture Electronic Program Guide (EPG) information, user interface information (e.g. for the control of video on demand (VOD) services, digital personal video recorders (PVRs), and etc) shown on the legacy STB. The captured video frames may be processed further by the communication device, or may be compressed and delivered to the UI STB for processing. The processing of the captured video frame may extract information contained in the video frames via optical character recognition and/or pattern recognition, possibly with the help of an online database. For example when performing automatic pattern recognition of an item in a captured frame of an EPG showing the English Premier League, a list of teams in the EPL may be accessed by the AV communication device or UI STB to improve the performance of the OCR or pattern recognition. The UI STB may then insert the information into a user interface, which is assumed to provide a more desirable UI than the legacy STB EPG. The generated UI may be provided by the AV communication device for display on one or more display devices. The AV communication device may provide information about the display device the UI will be displayed on to the UI generation component 228 of the UI STB, which may allow the UI STB to adjust the UI according to display characteristics of the display device, or based on the preference of a particular user (e.g. when the UI is displayed on a cellular phone of a particular user). The viewer of the display device may then react to/interact with the displayed UI via a remote control device (e.g. via infrared). The remote control signal may be captured by a receiving device on the AV communication device and provided to the UI STB, which processes the user input and renders the new UI for display. The user input may also control other functionalities of a TV and STB, such as changing the channel, setting the PVR, etc. The remote control output of such actions are intercepted by the AV communication device without the target device receiving the control output, and transmitted to the UI STB to control the UI generated by the UI STB. The AV communication device may send appropriate control commands to the connected devices. For example, when a user decides on a channel to view on the TV from the generated UI, the AV communication device may send a control command to the legacy STB to change to the selected channel. The AV communication device then displays the AV output from the legacy device instead of the UI generated by the UI STB.

As described above, the AV communication device may be connected to a UI STB that may provide various STB functionality as well as UI generation functionality. As described further below, the AV communication device may incorporate the UI STB functionality in a single device, which may be provided as a standalone component or may be incorporated into other devices, such as a television.

Figure 3:
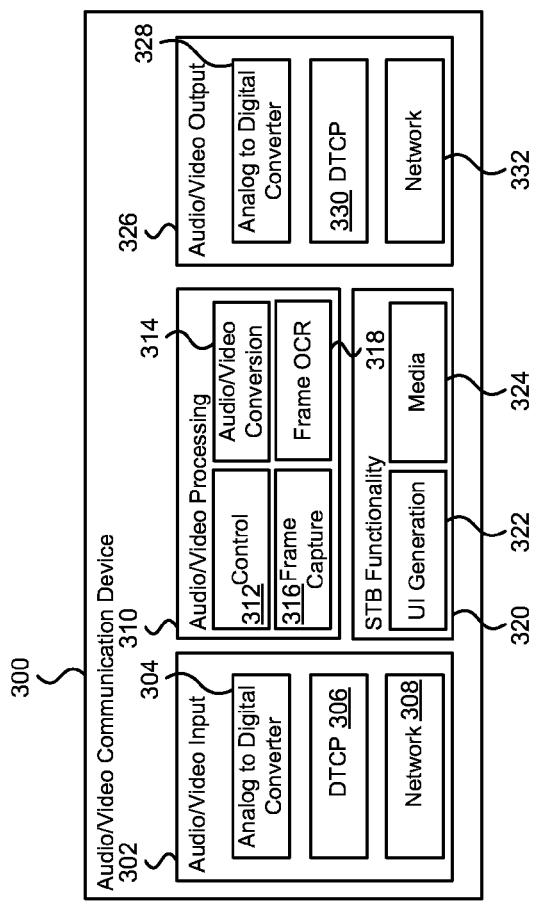
FIG. 3 depicts components of an audio/video communication device and User Interface (UI) set top box (STB)

FIG. 3 depicts components of an AV communication device and UI STB. The components of the AV communication device may be provided by hardware, software executing on hardware, firmware or combinations thereof. The components may include AV input components 302, AV processing and control components 310, STB functionality 320 and AV output components 326. The AV input components 302 generally allow the AV communication device 300 to receive AV content in multiple different formats. The AV processing and control components 310 generally allow the AV communication device 300 to capture and process AV content and control the AV communication device. The STB Functionality components 320 generally allow the AV communication device 300 to provide functionality of the UI STB described above. The AV output components 326 generally allow the AV communication device 300 to output AV content to one or more display devices using different formats.

The AV input components 302 may include, for example, an analog to digital converter 304 that can receive an analog AV signal and convert it into a digital format. The AV input components may also include Digital Transmission Content Protection (DTCP) or similar functionality 306 to receive and decrypt protected digital AV content in order to support the secure transport of high definition and digital content. The AV input components may also include network functionality 308 for receiving AV content over a network connection. The AV input components 302 allow the AV communication device to receive AV content from one or more different content sources in one or more different formats.

The AV processing and control components 310 include a control component 310 that controls the operation of the AV communication device 300. The control component may receive user input from one or more input devices and may output control commands for control connected devices. Further, the control component may determine when an EPG or UI is displayed by a connected device and may cause the UI STB functionality 320 to generate a UI and display it on the display device instead of the EPG or UI of the connected device. The AV processing and control components 310 may further include AV conversion component 314 which may receive AV content in one format and convert it to another format. The conversion may include, for example, resizing content to fit on a particular display device, or generating a UI based on user preference (e.g. when the UI is displayed on a cellular phone of a particular user). The AV processing and control components 310 may further include a frame capture component 316 that can capture a frame of the video content, for example when an EPG is displayed. A frame OCR component 318 may process the captured video frame to extract content from the frame that can be used in generating the UI. The control component 310 may also include Conditional Access (CA) or Digital Rights Management (DRM) functionality.

The STB Functionality components 320 may include a UI generation component 322 and a media component 324. The UI generation component 322 may receive the EPG content from the frame OCR component 318 and insert it into a UI. The UI generation component 322 may generate the UI for display from the EPG content and possibly other information that may be retrieved. For example, the UI generation component may receive the EPG content comprising schedule information indicating a number of TV shows on particular channels at particular times and retrieve additional information, such as a user rating of the TV shows, from an online service. The EPG content and additional information may be combined into a UI which can be displayed on the display devices. The STB functionality component 320 may further comprise media component 324 that can provide media content. The media component 324 may provide various types of content depending upon the desired functionality of the STB. For example, the media component 324 may provide access to online media, local media, games, cable television, satellite television, over-the-air (OTA) television, video on demand (VOD) services, digital personal video recorders (PVRs) or other media.

The AV output components 326 may include, for example, a digital to analog converter 328 that can receive a digital AV signal and convert it into an analog format. The AV output components may also include Digital Transmission Content Protection (DTCP) or similar functionality 330 to receive and encrypt digital AV content to a format that can be correctly authenticated, decrypted and decoded/displayed in order to support the secure transport of high definition and digital content. The AV output components may also include network functionality 332 for transmitting AV content over a network connection. The network connection may include functionality for controlling bandwidth used to transmit the AV content. The AV output components 326 allow the AV communication device to provide AV content to one or more different display devices in one or more different formats.

As described above, the components of the AV communication device and the UI STB may be provided by a single physical device. The device may be provided as a standalone device or may be incorporated into another device such as a television set. As described further below, the components of the AV communication device and the UI STB may be provided by physically separate components.

Figure 4:
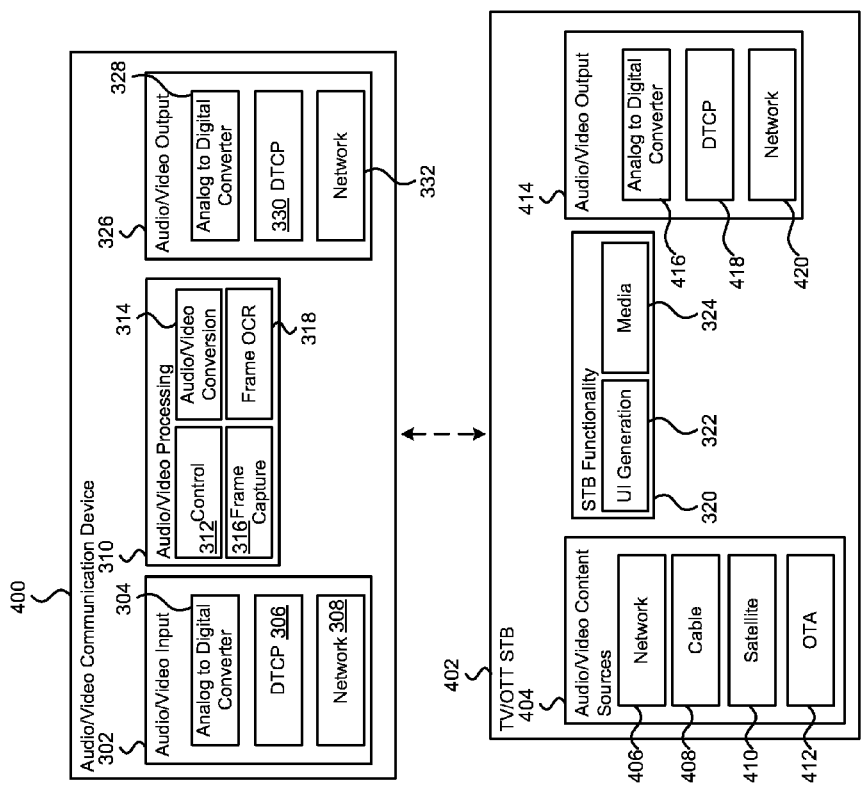
FIG. 4 depicts components of a further AV communication device and UI STB.

FIG. 4 depicts components of a further AV communication device and UI STB. The components of the AV communication device and UI STB may be substantially similar to those described above with reference to FIG. 3 and as such, their specific details are not described further. The AV communication device 400 may include the AV input components 302, the AV processing and control components 310 and the AV output 326. However, the STB functionality 320 is not included in the AV communication device but instead is included in a TV STB or OTT STB 402.

The TV/OTT STB 402 may be used to provide various AV content. The TV/OTT STB 402 may include one or more AV content sources 404. The AV content sources 404 may include for example a network connection, which may receive content over a network. The AV content sources 404 may further comprise cable TV functionality 408 or satellite TV functionality 410, which may include the conditional access (CA) systems. The AV content sources 404 may also include over the air functionality 412. The STB functionality 320 described above may be incorporated into the TV/OTT STB 402, which may also comprise one or more AV output components. The AV output components may include, for example, a digital to analog converter 416 that can receive a digital AV signal and convert it into an analog format. The AV output components may also include Digital Transmission Content Protection (DTCP) or similar functionality 418 to receive and encrypt digital AV content to a format that can be correctly authenticated, decrypted and decoded/displayed in order to support the secure transport of high definition and digital content. The AV output components may also include network functionality 420 for transmitting AV content over a network connection. The network connection may include functionality for controlling bandwidth used to transmit the AV content. The AV output components 414 allow the TV/OTT STB 402 to provide AV content to one or more different devices, including the AV communication device, in one or more different formats.

The AV communication device 400 and the TV/OTT STB 402 may communicate with each other using a one-way or two-way communication channel. The communication channel may be provided using a proprietary protocol. The AV communication device 400 may communicate control information as well as information for use in generating the UI, such as EPG content extracted from a captured frame, to the TV/OTT STB over the communication channel.

Figure 5:
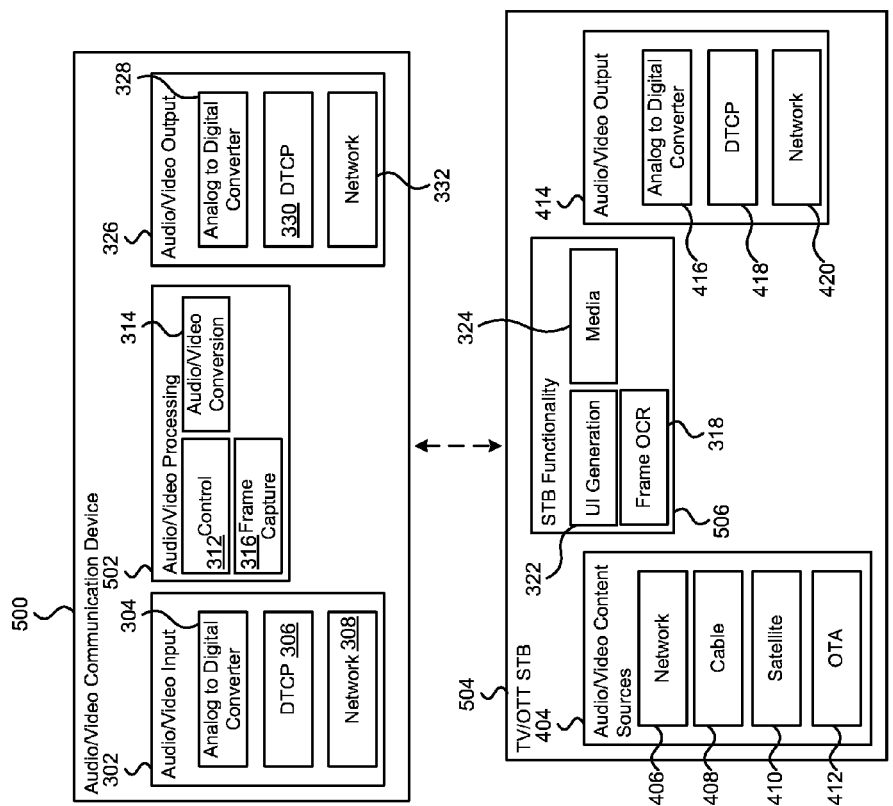
FIG. 5 depicts components of a further AV communication device and UI STB.

FIG. 5 depicts components of a further AV communication device and UI STB. The components of the AV communication device and UI STB may be substantially similar to those described above with reference to FIG. 4 and as such, their specific details are not described further. The AV communication device 500 may include the AV input components 302 and the AV output 326. However, the AV processing and control components 310 does not include the frame OCR component.

The AV communication device 500 includes AV processing components 502 including the control component 312, AV conversion component 314 and the frame capture component 316, but may not include the frame OCR component 318. The TV/OTT STB 504 may be similar to the TV/OTT STB 402 and may include the AV content sources 404 and AV outputs 414. However, the STB functionality 506 includes, in addition to the UI generation component 322 and the media component 324, the frame OCR component 318. Accordingly, the AV communication device may capture a frame of video, for example when an EPG is displayed and may possibly compress and transmit the captured frame to the TV/OTT STB which may perform OCR on the captured frame in order to extract any content, such as EPG content that be used in generating a UI.

Figure 6:
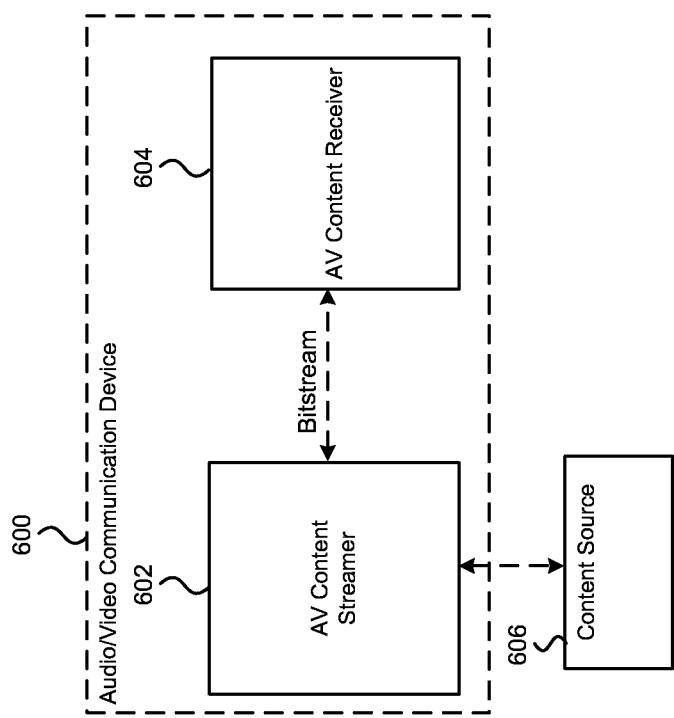
FIG. 6 depicts components of another AV communication device.

FIG. 6 depicts components of another AV communication device. The AV communication device 600 may provide substantially the same functionality as one or more of the AV communication devices 300, 400, 500 described above. However, rather than being provided by a single physical device, whether a standalone component or incorporated into an existing device such as a television, the AV communication device 600 comprises two separate physical components 602, 604.

The AV communication device 600 comprises an AV content streamer component 602 that may be connected to one or more content sources 606, such as a UI STB and a legacy STB. The content streamer component 602 may generate an AV bitstream of the AV content that is to be displayed on a display device. The bitstream is received by an AV content receiver component 604 that receives the AV bitstream and can convert it to a format suitable for display on a display device. For example, the AV content received component 604 may comprises a wireless communication device capable of receiving the bitstream, converting it to an AV signal and outputting the AV signal over an AV connector, such as HDMI, RCA component video, etc. Additionally or alternatively, the AV content receiver component 604 may be incorporated into the display device, and as such, does not need to output the AV signal over an AV connector, but rather can provide the AV signal directly for display.

Figure 7:
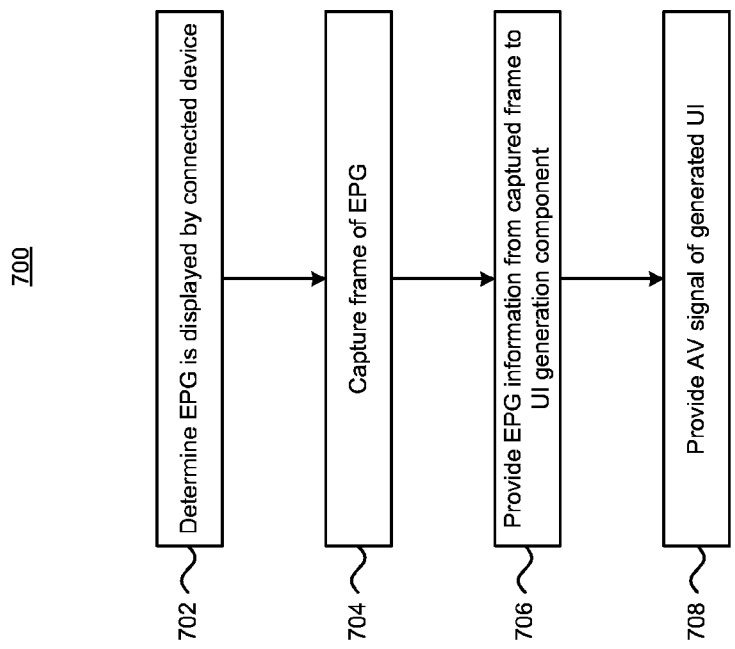
FIG. 7 depicts a method for controlling AV components in a home network.

FIG. 7 depicts a method for controlling AV components in a home network. The method 700 may be performed by one or more of the components and/or devices described above. The method begins with determining that an EPG is displayed by a connected device (702). The determination that the EPG is displayed may be made by detecting that the content displayed by the connected device, such as the legacy STB, has been static for a period of time. Further, the determination that the EPG is displayed may be made by intercepting, or detecting a control command for displaying the EPG. Although the EPG is displayed by the connected device, it may not be passed to the TV or other display device for display. Once the determination is made that the EPG is displayed, a frame of the EPG is captured (704). EPG information from the captured frame is provided to a UI generation component (706). The EPG information may be provided to the UI generation component (706) as the captured frame of video. Additionally, or alternatively the EPG information may be extracted from the captured frame, for example using OCR techniques, and provided to the UI generation component as a text string. After providing the EPG information, an AV signal of a UI generated based on the EPG content may be provided for display on one or more display devices.

The method 700 allows the a device, such as the AV communication device to detect that a less desirable EPG is displayed, or going to be displayed, and then to extract EPG content and use the EPG content to display a more desirable UI in place of the EPG.

Figure 8:
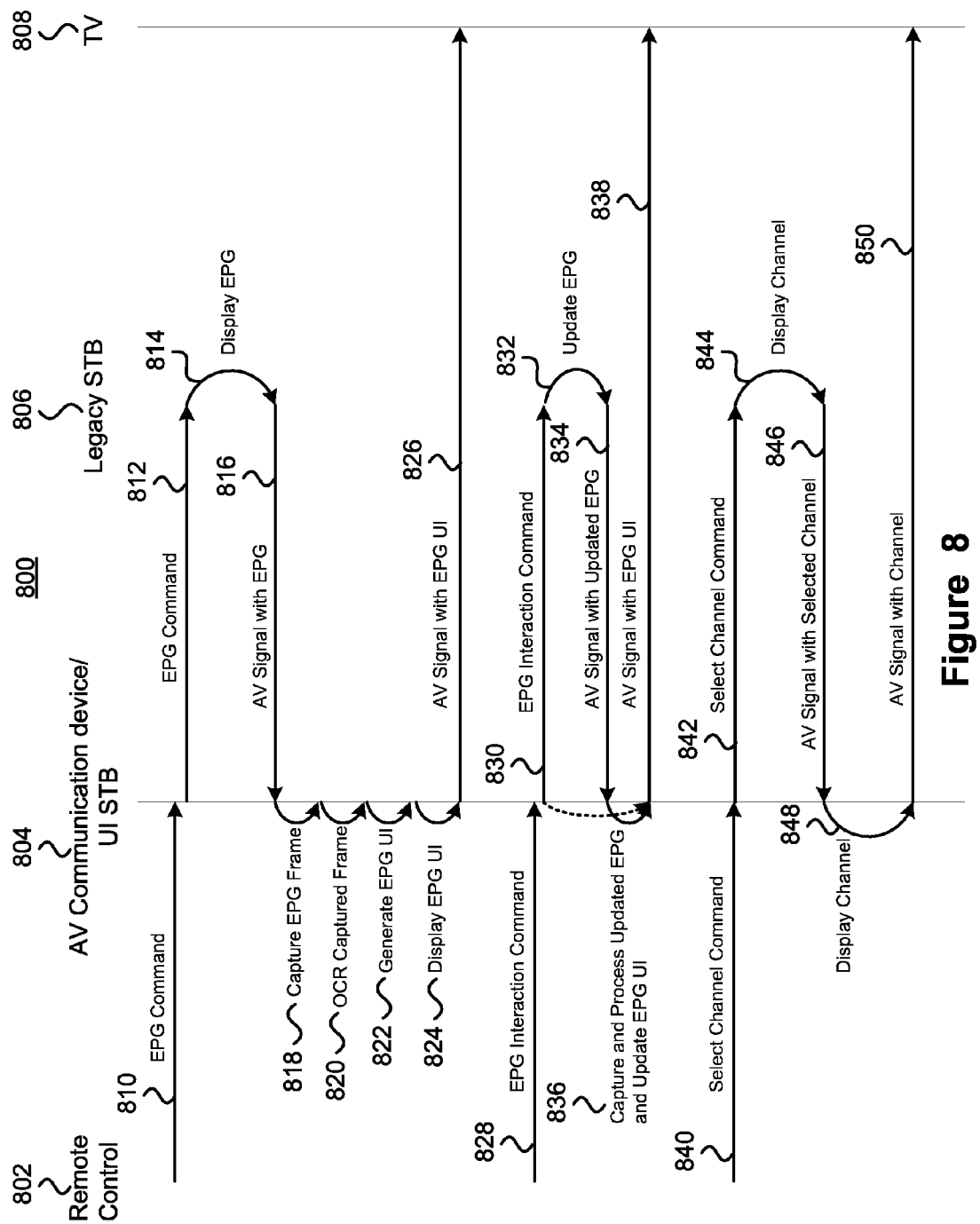
FIG. 8 depicts a process of controlling AV components in a home network.

FIG. 8 depicts a process of controlling AV components in a home network. The process 800 is performed between a remote control 802, an AV communication device/UI STB 804, a legacy STB 806 such as a cable TV STB, and a TV 808. The remote control sends an EPG command 810 for the legacy STB which is intercepted by the AV communication device/UI STB, indicating to the AV communication device/UI STB that the EPG is going to be displayed by the legacy device. The AV communication device/UI STB passed the EPG command 812 to the legacy STB, which renders the EPG 814. The rendered EPG is sent to the AV communication device/UI STB as an AV signal 816. The AV communication device/UI STB receives the AV signal with the EPG, captures a frame of the EPG 818, performs OCR on the captured frame to extract the EPG content 820, and then generates an EPG UI using the extracted EPG content 822. The AV communication device/UI STB displays the EPG UI 824 which is sent for display to the TV as an AV signal 826.

With the EPG UI displayed on the TV, the remote may be used to interact with the UI. For example an EPG interaction command 828 may be sent to the legacy STB from the remote, but may be intercepted by the AV communication device/UI STB, which may forward the EPG interaction command to the legacy device 830 which updates the EPG 832 which is sent to the AV communication device/UI STB as an AV signal 834. The AV communication device/UI STB updates the EPG UI based on the EPG interaction command, which may be updated based upon the received EPG interaction command, or may be determined by capturing and processing the updated EPG provided by the legacy STB 836. The updated EPG UI is provided to the TV from the AV communication device/UI STB as an AV Signal 838.

With the UI displayed, the user may select a particular AV content, such as a channel or show, for display. The remote may send a channel selection command 840 for the legacy STB, which is intercepted by the AV communication device/

UI STB and forwarded to the legacy STB 842. The legacy STB displays the selected channel 844, which is provided to the UI STB as an AV signal 846. The AV communication device/UI STB receives the channel signal and displays the channel, instead of the EPG UI, which is provided to the TV as an AV signal.

As described above, the less desirable EPG provided by the legacy STB may be replaced by a more desirable UI interface provided by a UI STB. The UI may be used to provide a consistent user experience when accessing different content from one or more legacy devices, regardless of the EPG or UI provided by the respective legacy devices.

As described above, the AV communication device may be physically separated from the content source receivers and display devices, or reside inside such devices (e.g. as a physical device or software instructions for configuring hardware). Furthermore, the functionality described in the present disclosure may be provided by one or more modules in devices connected to the AV communication device that may be logically controlled by the AV communication device, and so integrated into the AV communication device, in order to provide the functionality described above.

The hardware, software, firmware and combinations thereof providing the above described functionality may reside in the same physical enclosure, or may be distributed in multiple devices such as the television, the legacy STBs and the UI STB and a connected computing device such as a tablet or a cellular phone.

Although specific embodiments are described herein, it will be appreciated that modifications may be made to the embodiments without departing from the scope of the current teachings. Accordingly, the scope of the appended claims should not be limited by the specific embodiments set forth, but should be given the broadest interpretation consistent with the teachings of the description as a whole.

What is claimed is:

1. An audio/video (AV) device comprising:
    a plurality of AV inputs for receiving respective AV signals from a plurality of AV source devices;
    a plurality of AV outputs for providing AV content to one or more display devices to be displayed; and
    a processor for executing instructions stored in a memory, which when executed configure the AV device to:
        determine that a first user interface (UI) is displayed by a first AV signal comprising one of the received AV signals;
        capture a frame of the first UI from the first AV signal when it is determined that the first UI is displayed by the first AV signal;
        provide UI information from the captured frame to a user interface (UI) generation component for generating a second UI; and
        provide a second AV signal of the generated second UI to one or more of the plurality of the AV outputs,
        wherein the instructions to determine that the first UI is displayed comprise instructions to receive a control command for the first AV source to display the first UI, and
        wherein the instructions to determine that the first UI is displayed further comprise instructions to provide the received control command to the first AV source device to display the first UI.

2. The AV device of claim 1, wherein the instructions further configure the AV device to:
    perform optical character recognition (OCR) on the first UI of the captured frame to determine the UI information.

3. The AV device of claim 2, further comprising:
    a second AV input for receiving a second AV signal from a second AV source device capable of generating the second UI incorporating the UI information,
    wherein the instructions further configure the AV device to communicate the UI information to the second AV source device; and
    receive a UI signal of the second UI from the second AV device for use as the second AV signal.

4. The AV device of claim 1, wherein the instructions further comprise instructions allowing interaction with the second UI.

5. The AV device of claim 4, wherein the instructions further comprise instructions for providing to the AV output AV content from the first AV source selected from the second UI.

6. The AV device of claim 1, wherein the control command is received over an infrared (IR) channel.

7. The AV device of claim 1, further comprising a network interface for providing one or more AV signals to one or more display devices.

8. The AV device of claim 7, wherein the one or more display devices comprise one or more communication devices connected to a common local network and/or one or more communication devices connected to a remote network.

9. The AV device of claim 8, wherein the instructions further configure the AV device to provide AV functionality including one or more of:
    accessing local AV content;
    accessing remote AV content; and
    playing games.

10. The AV device of claim 9, wherein the instructions further configure the AV device to authenticate the one or more display devices to provide the one or more AV signals.

11. The AV device of claim 1, wherein the first UI comprises an electronic programming guide (EPG) generated by the first AV source device.

12. The AV device of claim 1, comprising:
    a content streaming component for generating AV content to be displayed and transmitting the AV content as a bitstream; and
    a content receiving component for receiving the bitstream and generating an AV content signal suitable for display.

13. The AV device of claim 12, wherein the content streaming component and the content receiving component communicate using a wireless communication channel.

14. The AV device of claim 1, wherein the AV device is adapted to stream AV content from one or more of the plurality of AV sources to one or more display devices.

15. The AV device of claim 1, wherein the AV device is a virtual controller device adapted for controlling multiple devices.

16. A method for providing a user interface by an audio/video (AV) device, the method comprising:
    determining at the AV device that a first user interface (UI) is displayed by a first AV signal from a first AV source device of a plurality of AV source devices connected to the AV device;
    capturing a frame of the first UI from the first AV signal when it is determined that the first UI is displayed by the first AV signal;
    providing UI information from the captured frame to a user interface (UI) generation component for generating a second UI; and providing a second AV signal of the generated second UI to an AV output of a plurality of AV outputs providing AV content to one or more display devices,
wherein the determining that the first UI is displayed comprises receiving a control command for the first AV source to display the first UI, and
wherein determining that the first UI is displayed further comprises providing the received control command to the first AV source device to display the first UI.

17. The method of claim 16, further comprising:
performing optical character recognition (OCR) on the first UI of the captured frame to determine the UI information.

18. The method of claim 17, wherein the UI generation component is provided by a second AV device, the method further comprising:
communicating the UI information to the second AV source device; and
receiving a UI signal of the second UI from the second AV device for use as the second AV signal.

19. The method of claim 16, further comprising allowing interaction with the second UI.

20. The method of claim 19, further comprising providing to the AV output AV content from the first AV source selected from the second UI.

21. The method of claim 16, wherein the control command is received over an infrared (IR) channel.

22. The method of claim 16, further comprising authenticating one or more display devices to provide one or more AV signals.

23. The method of claim 16, wherein the first UI comprises an electronic programming guide (EPG) generated by the first AV source device.

24. The method of claim 16, further comprising:
generating AV content to be displayed;
transmitting the AV content as a bitstream;
receiving the bitstream; and
generating an AV content signal suitable for display.

25. The method of claim 24, wherein the AV content is transmitted using a wireless communication channel.

26. The method of claim 16, wherein the AV device is adapted to stream AV content from one or more of the plurality of AV sources to one or more display devices.

27. The method of claim 16, wherein the AV device is a virtual controller device adapted for controlling multiple devices.

* * * * *